(12) United States Patent
Takeda

(10) Patent No.: US 8,400,850 B2
(45) Date of Patent: Mar. 19, 2013

(54) SEMICONDUCTOR STORAGE DEVICE AND ITS CELL ACTIVATION METHOD

(75) Inventor: Koichi Takeda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 192 days.

(21) Appl. No.: 13/041,566

(22) Filed: Mar. 7, 2011

(65) Prior Publication Data

US 2011/0222360 A1 Sep. 15, 2011

(30) Foreign Application Priority Data

Mar. 10, 2010 (JP) ................................. 2010-053298

(51) Int. Cl.
*G11C 7/00* (2006.01)
(52) U.S. Cl. .................... 365/191; 365/154; 365/189.11; 365/189.15; 365/207
(58) Field of Classification Search .......................... None
See application file for complete search history.

(56) References Cited

U.S. PATENT DOCUMENTS

| | | | |
|---|---|---|---|
| 6,212,117 B1 * | 4/2001 | Shin et al. ...................... | 365/205 |
| 7,570,540 B2 * | 8/2009 | Nii ............................ | 365/230.05 |
| 8,134,863 B2 * | 3/2012 | Takeda ........................... | 365/156 |
| 8,164,962 B2 * | 4/2012 | Takeda ........................... | 365/191 |

FOREIGN PATENT DOCUMENTS

JP 2006-040466 A 2/2006

OTHER PUBLICATIONS

K. Zhang, et al., "A 3-GHz 70Mb SRAM in 65nm CMOS Technology with Integrated Column-Based Dynamic Power Supply," ISSCC 2005, Session 26, Non-Volatile Memory, 2005, pp. 474-475, vol. 26.1.

* cited by examiner

*Primary Examiner* — Tan T. Nguyen
(74) *Attorney, Agent, or Firm* — Sughrue Mion, PLLC

(57) ABSTRACT

A semiconductor storage device in accordance with the present invention includes a first SRAM cell that stores data, and a word line circuit that outputs a first control signal used to activate the first SRAM cell. The word line control circuit gradually raises the voltage level of the first control signal from a substrate potential to a first power supply potential in a first activation period, maintains the voltage level of the first control signal at the first power supply potential in a second activation period subsequent to the first activation period, and raises the voltage level of the first control signal from the first power supply potential to a second power supply potential in a third activation period subsequent to the second activation period.

22 Claims, 11 Drawing Sheets

SEMICONDUCTOR STORAGE DEVICE AND ITS CELL ACTIVATION METHOD

CROSS-REFERENCE TO RELATED APPLICATIONS

This application is based upon and claims the benefit of priority from Japanese patent application No. 2010-053298, filed on Mar. 10, 2010, the disclosure of which is incorporated herein in its entirety by reference.

BACKGROUND

1. Field of the Invention

The present invention relates to a semiconductor storage device and its cell activation method. In particular, the present invention relates to a semiconductor storage device having an SRAM (Static Random Access Memory) as storage cells and its cell activation method.

2. Description of Related Art

Owing to their high process compatibility, static random access memories (hereinafter simply referred to as "SRAMs") have been integrated into semiconductor devices with various function blocks including CPUs in the past. The high packing density and the high operating speed of semiconductor devices have been achieved by miniaturizing transistors, which are the basic elements of the semiconductor devices. Therefore, SRAMs, which are integrated into such semiconductor devices, are also desired to be miniaturized to achieve the higher packing density and the higher operating speed.

However, in recent years, as the CMOS process has been miniaturized, element variations in transistors constituting SRAM cells has been increasing. This increase in element variations has been causing a problem in read operations in SRAM cells that the reading characteristic deteriorates and the stored data is thereby corrupted. Further, it also has been causing a problem in write operations in SRAM cells that the writing characteristic deteriorates. Further, because of these deteriorations in characteristics, there has been another problem that yields in large-scale SRAM manufacturing are lowered. To suppress this decrease in yields, it is necessary to increase the size of transistors constituting SRAM cells to reduce the element variations. However, the increase in transistor size causes a problem that the size of SRAM cells becomes larger.

Accordingly, K. Zhang, et al., "A 3-GHz 70 Mb SRAM in 65 nm CMOS Technology with Integrated Column-Based Dynamic Power Supply" ISSCC2005 (K. Zhang, et al.) discloses a technique to solve this problem. In K. Zhang, et al., the potential of word line signals output from a word line control circuit is controlled so as to be lower than the power supply potential of SRAM cells. In this way, the technique disclosed in K. Zhang, et al. can improve the reading characteristic and thereby suppress the corruption of stored data in read operations of the SRAM cells. Further, the potential of the word line signals is controlled so as to be lower than the power supply potential of the SRAM cells in write operations of the SRAM cells. In this way, the technique disclosed in K. Zhang, et al. can improve the writing characteristic during write operations in the SRAM cells.

Further, Japanese Unexamined Patent Application Publication No. 2006-040466 discloses a technique to improve a reading characteristic and a data retention characteristic. In Japanese Unexamined Patent Application Publication No. 2006-040466, the potential of word line signals is controlled to two levels consisting of first and second power supply potentials in order to perform stable access operations for a high resistance load type SRAM. A reading operation is performed while the potential of the word line signal is at the first power supply potential. Further, after a potential difference between a pair of bit lines is amplified by a sense amplification circuit, the potential of the word line signal is controlled to the second power supply potential to perform a writing operation. In SRAM cells in which the wiring operation is not performed, i.e., in pseudo-read cells, the stored data is written back to the cells by the sense amplification circuit. Therefore, the writing operation is performed without causing any corruption of the stored data in the pseudo-read cells.

SUMMARY

The present inventors have found the following problem. As described above, in the technique disclosed in K. Zhang, et al., three different power supplies need to be supplied to the SRAM in order to improve both the reading characteristic and the writing characteristic. Meanwhile, in the technique disclosed in Japanese Unexamined Patent Application Publication No. 2006-040466, two different power supplies need to be supplied to the word line control circuit. However, as the miniaturization in the manufacturing process of semiconductor devices will be advanced further, it is expected that the reading characteristic will deteriorate even further. Therefore, in order to suppress the deterioration in the reading characteristic or to improve the reading characteristic, it is necessary to control the two power supplies supplied to the word control circuit to potentials different from that of the power supply to the SRAM cells. That is, in SRAM cells to which the technique disclosed in K. Zhang, et al. or Japanese Unexamined Patent Application Publication No. 2006-040466 is applied, three different power supplies are required to perform the access operations to the SRAM cells.

As described above, three different power supplies need to be supplied to the SRAM in order to improve both the reading characteristic and the writing characteristic. However, the number of power supplies that can be supplied to an SRAM is one in ordinary semiconductor devices. Therefore, to use power supplies having different voltages for the access operations to the SRAM, it is necessary to add a power supply circuit(s) that supplies the power supply(s) having a different voltage(s). That is, in SRAM cells to which the technique disclosed in K. Zhang, et al. or Japanese Unexamined Patent Application Publication No. 2006-040466 is applied, there is a problem that the circuit size increases because of the additional power supply circuit(s) that is added to perform stable access operations to the SRAM.

A first aspect of the present invention is a semiconductor storage device including: a plurality of first SRAM cells that store data, the plurality of first SRAM cells being arranged in a lattice pattern; a plurality of first bit line pairs provided along first SRAM cells arranged in a column direction; a plurality of second SRAM cells each provided for one of the first bit line pairs, each of the plurality of second SRAM cells being configured to amplify and store a potential difference between read signals output to a corresponding one of the first bit line pairs; a control cell that controls an amplification function of the plurality of second SRAM cells; at least one second bit line pair provided in the plurality of second SRAM cells; a word line control circuit that outputs a first control signal used to activate first SRAM cells arranged on a row selected by a row address in the plurality of first SRAM cells, a second control signal used to activate a second SRAM cell selected by a column address in the plurality of second SRAM cells, and a third control signal used to activate the control cell; a plurality of word lines provided along first SRAM cells arranged in a row direction, the plurality of word lines being configured to transmit the first control signal; a sense amplification circuit that amplifies a potential difference between read signals output from a second SRAM cell activated based on the second control signal to the second bit line pair; and a write control circuit that outputs a write signal to the second SRAM cell activated based on the second control signal through the second bit line pair, in which the word line control circuit: in a first activation period, raises a voltage level of the first control signal from a substrate potential to a predetermined potential at a first rate, and then raises the voltage level from the predetermined potential to a first power supply potential at a second rate lower than the first rate; in a second activation period subsequent to the first activation period, maintains the voltage level of the first control signal at the first power supply potential; and in a third activation period subsequent to the second activation period, raises the voltage level of the first control signal from the first power supply potential to a second power supply potential.

Another aspect of the present invention is a semiconductor storage device including: a plurality of first SRAM cells that store data, the plurality of first SRAM cells being arranged in a lattice pattern; a plurality of first bit line pairs provided along first SRAM cells arranged in a column direction; a plurality of second SRAM cells each provided for one of the first bit line pairs, each of the plurality of second SRAM cells being configured to amplify and store a potential difference between read signals output to a corresponding one of the first bit line pairs; a control cell that controls an amplification function of the plurality of second SRAM cells; at least one second bit line pair provided in the plurality of second SRAM cells; a word line control circuit that outputs a first control signal used to activate first SRAM cells arranged on a row selected by a row address in the plurality of first SRAM cells, a second control signal used to activate a second SRAM cell selected by a column address in the plurality of second SRAM cells, and a third control signal used to activate the control cell; a plurality of word lines provided along first SRAM cells arranged in a row direction, the plurality of word lines being configured to transmit the first control signal; a sense amplification circuit that amplifies a potential difference between read signals output from a second SRAM cell activated based on the second control signal to the second bit line pair; and a write control circuit that outputs a write signal to the second SRAM cell activated based on the second control signal through the second bit line pair, in which the word line control circuit: in a first activation period, raises a voltage level of the first control signal from a substrate potential to a first power supply potential at a rate determined by a limited current having a limited maximum current value; in a second activation period subsequent to the first activation period, maintains the voltage level of the first control signal at the first power supply potential; and in a third activation period subsequent to the second activation period, raises the voltage level of the first control signal from the first power supply potential to a second power supply potential.

Another aspect of the present invention is a cell activation method for a semiconductor storage device including SRAM cells that hold externally-provided data, an activation state of the SRAM cells being controlled based on a first control signal provided through a word line, the cell activation method including: in a first activation period, raising a voltage level of the first control signal from a substrate potential to a predetermined potential at a first rate, and then raising the voltage level from the predetermined potential to a first power supply potential at a second rate lower than the first rate; in a second activation period subsequent to the first activation period, maintaining the voltage level of the first control signal at the first power supply potential; and in a third activation period subsequent to the second activation period, raising the voltage level of the first control signal from the first power supply potential to a second power supply potential.

In a semiconductor storage device and its cell activation method in accordance with an aspect of the present invention, the first control signal, which is used to activate SRAM cells that hold data, is controlled to a different voltage level in each of the first to third activation periods. That is, in a semiconductor storage device and its cell activation method in accordance with an aspect of the present invention, SRAM cells are activated with stability, without turning on/off the power supply, by controlling the voltage level of the first control signal. In this way, in accordance with a semiconductor storage device and its cell activation method according to an aspect of the present invention, it is possible to operate a semiconductor storage device with only one power supply even when the semiconductor storage device includes SRAM cells having a deteriorated data retention characteristic.

In accordance with a semiconductor storage device and its cell activation method according to an aspect of the present invention, it is possible to improve the data reading characteristic and the writing characteristic of SRAM cells while minimizing the circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION

First Embodiment

Figure 1:
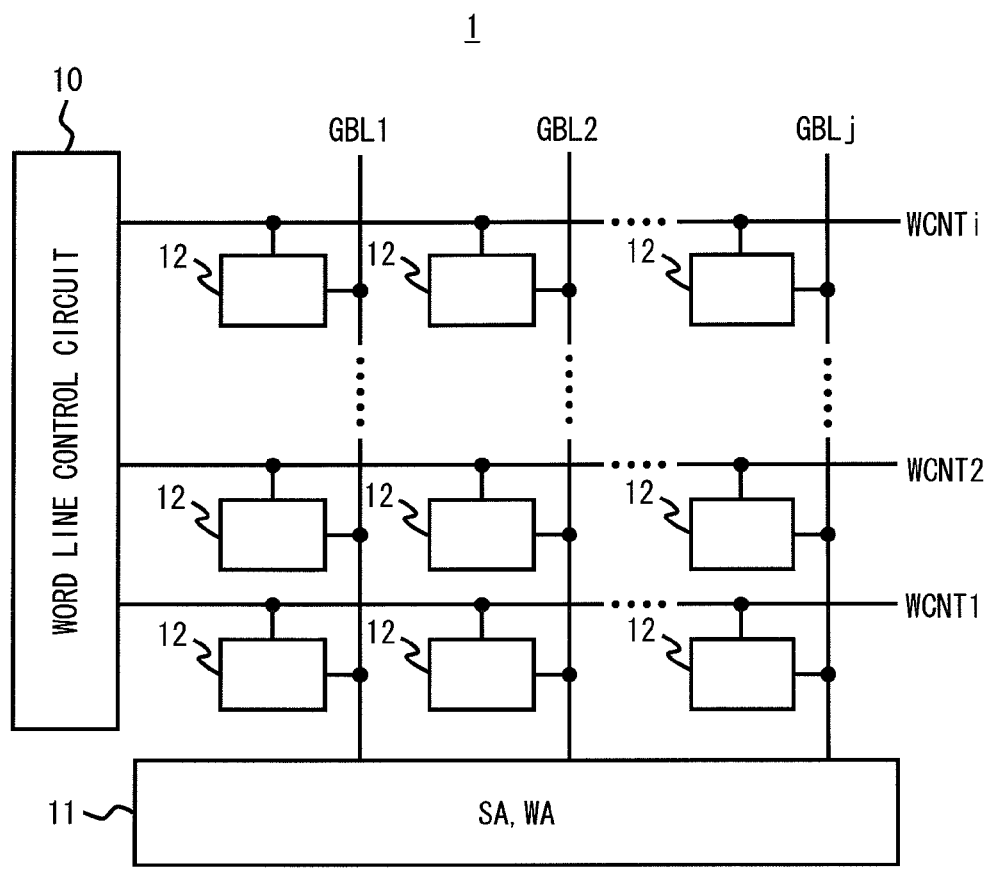
FIG. 1 is a block diagram of a semiconductor storage device in accordance with a first embodiment of the present invention.

Embodiments in accordance with the present invention are explained hereinafter with reference to the drawings. Firstly, FIG. 1 shows a block diagram of a semiconductor storage device 1 in accordance with a first embodiment of the present invention. Although the following explanation is made while focusing attention on the functions of an SRAM as a semiconductor storage device, the semiconductor storage device in accordance with the present invention may be a semiconductor storage device in which an SRAM is integrally formed with other functional circuits such as a CPU. The semiconductor storage device 1 shown in FIG. 1 includes a word line control circuit 10, an I/O circuit 11 in which a sense amplifier SA and a write control circuit WA are disposed, and a plurality of SRAM circuits 12. In this embodiment, all of the word line control circuit 10, the I/O circuit 11, and the SRAM circuits 12 operate based on a first power supply potential (e.g., power supply potential supplied from a power supply terminal VDD) and a substrate potential (e.g., ground potential supplied from a ground terminal GND).

The word line control circuit 10 outputs groups of row control signals WCNT1 to WCNTi (i is an integer no less than 1, and indicates a row number of an SRAM circuit 12) to the SRAM circuits 12 based on control signals supplied from other circuits (not shown). Each of these row control signal groups WCNT1 to WCNTi includes first to third control signals and a pre-charge enable signal (which are described later).

The I/O circuit 11 includes a sense amplifier SA and a write control circuit WA. The sense amplifier SA amplifies a voltage difference between signals read from an SRAM circuit 12 through a pair of second bit lines (for example, one of global bit line pairs GBL1 to GBLj (j is an integer no less than 1, and indicates a column number of an SRAM circuit 12)), and externally outputs reproduced data based on that voltage difference. The write control circuit WA drives one of the global bit line pairs GBL1 to GBLj based on an externally-supplied input signal, and writes data based on the input signal to an SRAM circuit 12.

The plurality of SRAM circuits 12 are arranged in a lattice pattern. Further, SRAM circuits 12 arranged on the same row are controlled by the same row control signal group. Further, SRAM circuits 12 arranged on the same column are connected to the same global bit line pair. Each of the SRAM circuits 12 includes a plurality of SRAM cells (the details of them are described later).

Figure 2:
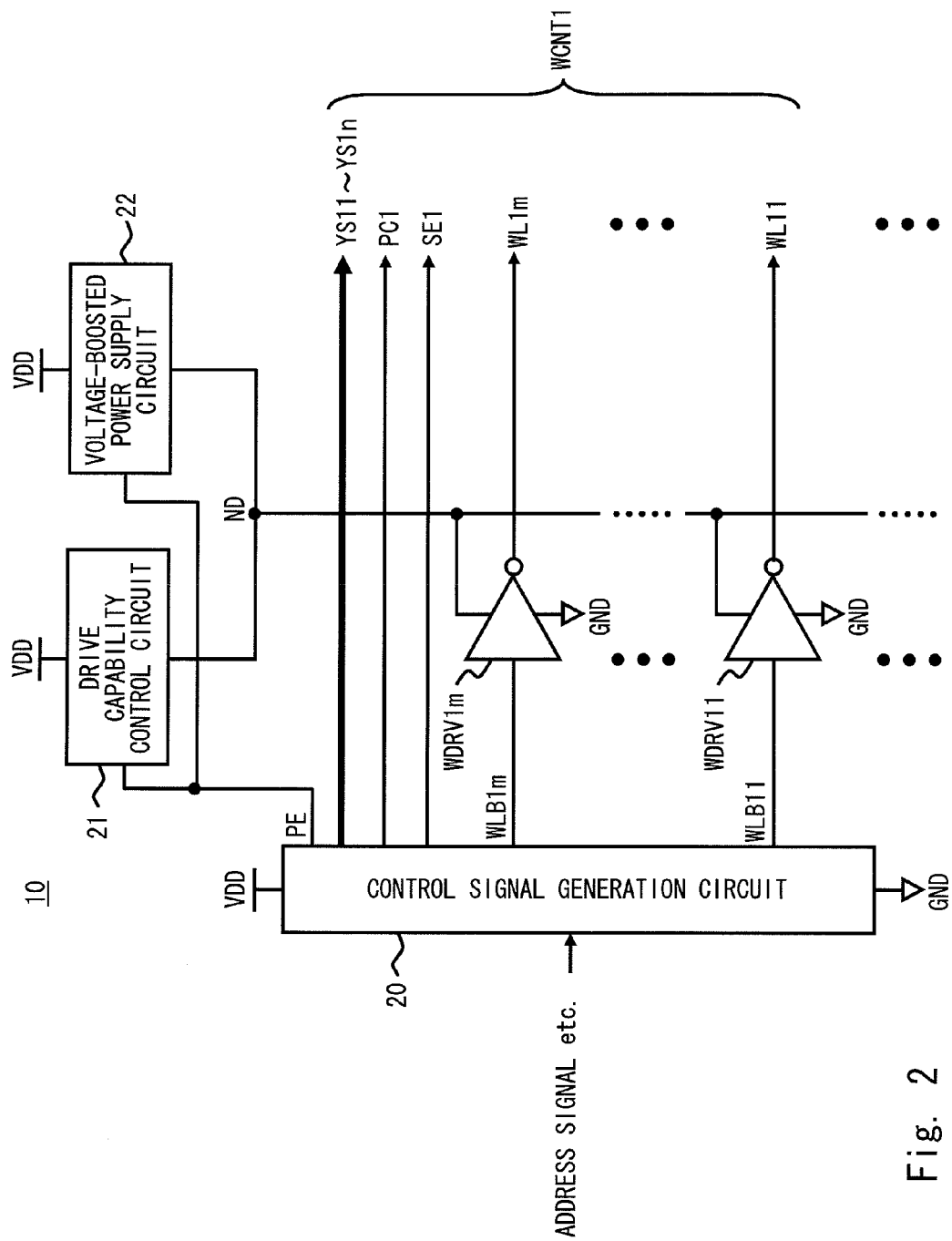
FIG. 2 is a block diagram of a word line control circuit in accordance with a first embodiment of the present invention.

Next, FIG. 2 shows a block diagram of a word line control circuit 10. Then, the word line control circuit 10 is explained in detail with reference to FIG. 2. As shown in FIG. 2, the word line control circuit 10 outputs groups of row control signals Each of the row control signal groups includes a first control signal (e.g., first word select signal WL), a second control signal (second word select signal YS), a third control signal (sense enable signal SE), and a pre-charge enable signal PC. Note that FIG. 2 shows only a part of the word line control circuit 10 that outputs a row control signal group WCNT1, which is supplied to a SRAM circuit 12 disposed on the first row, among the plurality of row control signal groups. Note also that the row control signal group WCNT1 includes first word select signals WL11 to WL1$m$ ($m$ is an integer no less than 1, and indicates a row number of an SRAM cell contained in a given SRAM circuit 12), second word select signals YS11 to YS1$n$ ($n$ is an integer no less than 1, and indicates a column number of an SRAM cell contained in a given SRAM circuit 12), a pre-charge signal PC1, and a sense enable signal SE1.

As shown in FIG. 2, the word line control circuit 10 includes a control signal generation circuit 20, word line drivers WDRV11 to WDRV1$m$, a drive capability control circuit 21, and a voltage-boosted power supply circuit 22.

The control signal generation circuit 20 outputs a voltage-boost control signal PE, a second word select signal YS1, a pre-charge enable signal PC1, a sense enable signal SE1, and signals WLB11 to WLB1$m$ based on control signals including an address signal. The signals WLB11 to WLB1$m$ are input signals to the word line drivers WDRV11 to WDRV1$m$. More specifically, the control signal generation circuit 20 activates one of the signals WLB11 to WLB1$m$ based on the address signal. In this embodiment, since each of the word line drivers WDRV11 to WDRV1$m$ forms an inverter, each of the signals WLB11 to WLB1$m$ is a signal obtained by inverting a respective one of the first word select signals WL11 to WL1$m$. Therefore, each of the signals WLB11 to WLB1$m$ indicates an active state when it is at a low potential. Further, the control signal generation circuit 20 activates one of the second word select signals YS11 to YS1$n$ based on the address signal. Each of the second word select signals YS11 to YS1$n$ indicates an active state when it is at a high potential. Further, the control signal generation circuit 20 controls the timings at which the logical levels of the output signals are switched based on a read control signal or a write control signal, which is supplied in synchronization with the address signal.

Note that the first word select signals WL11 to WL1$m$ are signals used to control the active states of first SRAM cells (which are described later). The second word select signals YS11 to YS1$n$ are signals used to control the active states of second SRAM cells (which are described later). The pre-charge enable signal PC1 is a signal used to control the timing at which a first bit line pair provided in an SRAM circuit 12 is pre-charged. The sense enable signal SE1 is a signal used to control the active state of a control cell (which is described later).

The word line drivers WDRV11 to WDRV1$m$ invert and amplify the signals WLB11 to WLB1$m$ output by the control signal generation circuit 20, and output the obtained signals as first word select signals WL11 to WL1$m$. The word line drivers WDRV11 to WDRV1$m$ operate based on a power supply supplied from a substrate potential (e.g., ground potential supplied from a ground terminal GND) and a drive power supply node ND.

A specific circuit of the word line drivers WDRV11 to WDRV1$m$ is explained hereinafter. In this embodiment, since each of the word line drivers WDRV11 to WDRV1$m$ has the same circuit configuration, they are explained by using the word line driver WDRV11 as an example. Therefore, FIG. 3 shows a circuit diagram of the word line driver WDRV11.

Figure 3:
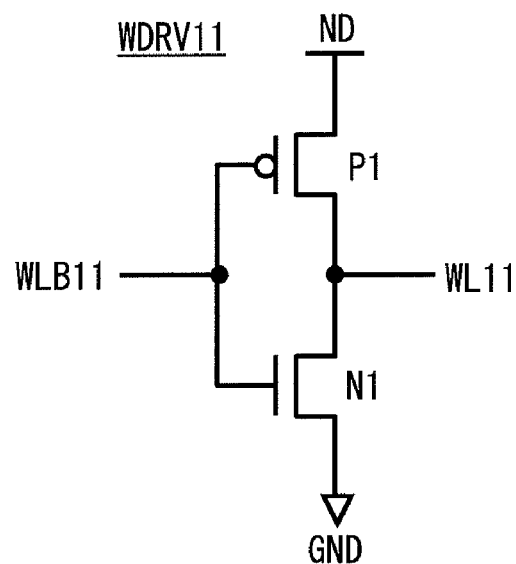
FIG. 3 is a circuit diagram of a word line driver in accordance with a first embodiment of the present invention.

As shown in FIG. 3, the word line driver WDRV11 includes an NMOS transistor N1 and a PMOS transistor P1. The source of the NMOS transistor N1 is connected to a ground terminal GND, and the drain is connected to the drain of the PMOS transistor P1. Further, a signal WLB11 is input to the gate of the NMOS transistor N1. Further, the source of the PMOS transistor P1 is connected to a drive power supply node ND, and the drain is connected to the drain of the NMOS transistor N1. Further, the signal WLB11 is input to the gate of the PMOS transistor P1. Furthermore, a first word select signal WL11 is output from the connection point between the drains of the NMOS transistor N1 and the PMOS transistor P1. That is, the word line driver WDRV11 forms an inverter gate by the NMOS transistor N1 and the PMOS transistor P1.

Next, the drive capability control circuit 21 is explained. The drive capability control circuit 21 is connected to the drive power supply node ND of the word line drivers WDRV11 to WDRV1$m$, and determines the rising rate (e.g., second rate) of the first word select signals WL11 to WL1$m$. Further, the drive capability control circuit 21 outputs a limited current having a limited maximum current value. Further, the current value of this limited current determines the rising time of the first word select signals WL11 to WL1$m$. Note that the drive capability control circuit 21 is set to a current drive capability lower than that of the word line drivers WDRV11 to WDRV1$m$. That is, if the drive power supply node ND is directly connected to the power supply terminal VDD without interposing the drive capability control circuit 21 therebetween and the word lines are driven by word line drivers WDRV11 to WDRV1$m$ in that configuration, the first word select signals WL11 to WL1$m$ reach the power supply potential in a very short time without going through a first activation period (which is described later).

Figure 4:
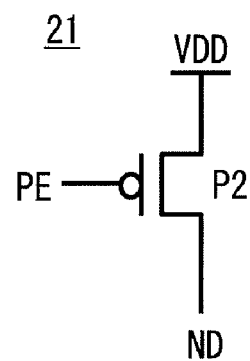
FIG. 4 is a circuit diagram of a drive capability control circuit in accordance with a first embodiment of the present invention.

The details of the drive capability control circuit 21 are explained hereinafter. Therefore, FIG. 4 shows a circuit diagram of the drive capability control circuit 21. As shown in FIG. 4, the drive capability control circuit 21 includes a PMOS transistor P2. The drain of the PMOS transistor P2 is connected to a power supply terminal VDD and the source is connected to the drive power supply node ND. Further, a voltage-boost control signal PE is input to the gate of the PMOS transistor P2. That is, when the voltage-boost control signal PE is at a high potential (e.g., power supply potential), the drive capability control circuit 21 becomes a cut-off state. Further, when the voltage-boost control signal PE is at a low potential (e.g., substrate potential), the drive capability control circuit 21 becomes a conductive state. Further, the drive capability control circuit 21 outputs a current having a maximum current value that is determined based on the transistor size and the voltage difference between the source and gate of the PMOS transistor P2 (e.g., limited current) in a conductive state.

Next, the voltage-boosted power supply circuit 22 is explained. The voltage-boosted power supply circuit 22 is connected to the drive power supply node ND of the word line drivers WDRV11 to WDRV1$m$. The voltage-boosted power supply circuit 22 generates a second power supply potential (e.g., voltage-boosted potential) by raising the potential of the drive power supply node ND (e.g., power supply potential), and supplies the generated voltage-boosted potential to the word line drivers WDRV11 to WDRV1$m$. Further, the voltage-boosted power supply circuit 22 switches whether the voltage-boosted potential is generated or not based on the voltage level of the voltage-boost control signal PE.

Figure 5:
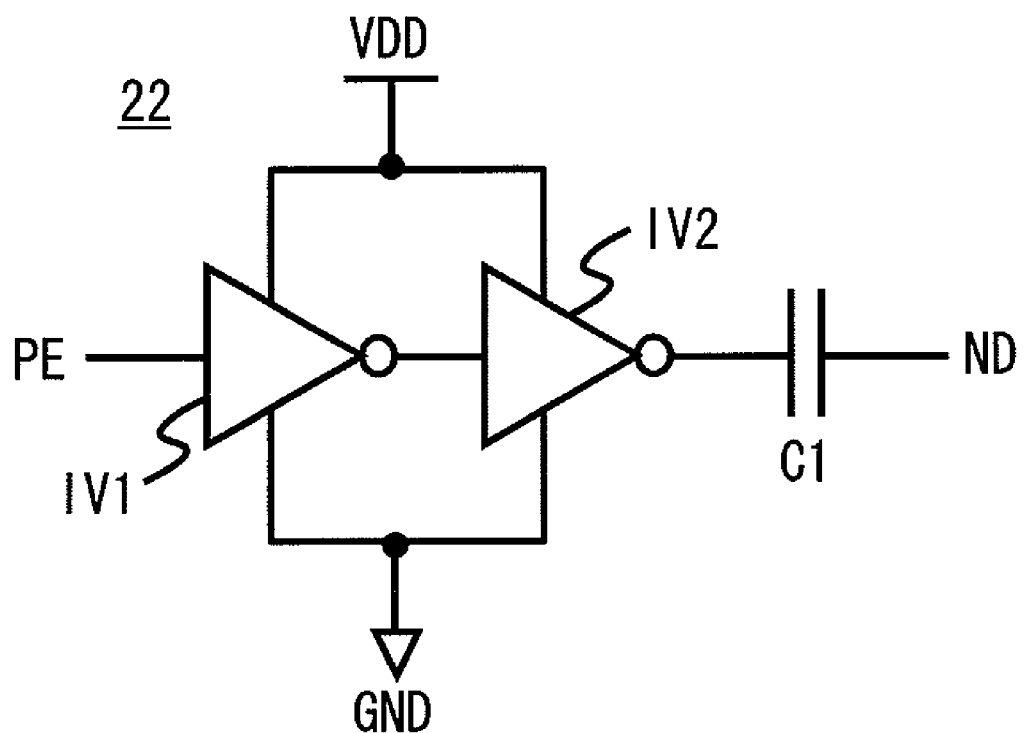
FIG. 5 is a circuit diagram of a voltage-boosted power supply circuit in accordance with a first embodiment of the present invention.

The details of the voltage-boosted power supply circuit 22 are explained hereinafter. Therefore, FIG. 5 shows a circuit diagram of the voltage-boosted power supply circuit 22. As shown in FIG. 5, the voltage-boosted power supply circuit 22 includes inverter gates IV1 and IV2, and a capacitive element (e.g., capacitor C1). Each of the inverter gates IV1 and IV2 is an inversion circuit that operates based on a substrate potential and a power supply potential. Further, the inverter gates IV1 and IV2 are connected in series, and therefore the inverter gate IV2 outputs a signal having the same logic level as that of the voltage-boost control signal PE input to the inverter gate IV1. The inverter gates IV1 and IV2 form a voltage boost driver circuit. One end of the capacitor C1 is connected to the output terminal of the inverter gate IV2. The other end of the capacitor C1 is connected to the drive power supply node ND. That is, in this embodiment, when the voltage-boost control signal PE is at a low potential (e.g., substrate potential) and the drive power supply node ND is at the power supply potential, an electrical charge corresponding to the potential difference between the substrate potential and the power supply potential is accumulated in the capacitor C1. Then, when the voltage-boost control signal PE is changed to a high potential, the potential at the terminal on the inverter gate IV2 side of the capacitor C1 becomes the power supply potential. Therefore, the potential at the drive power supply node ND is raised by the electrical charge accumulated in the capacitor C1. In this embodiment, the potential at the drive power supply node ND that is raised by the capacitor C1 is referred to as "voltage-boosted potential". Further, when the voltage level of any one of the first word select signals WL11 to WL1$m$ is raised, the electrical charge that is accumulated in the capacitor C1 during a period in which the voltage-boost control signal PE is at a low potential is used in the early stage of its potential raising period and thereby shortens the potential raising period of the first word select signals WL11 to WL1$m$.

One of the features of the word line control circuit 10 in accordance with this embodiment lies in the control procedure of various control signals included in the row control signal groups WCNT1 to WCNTi. Therefore, the control procedure of the various control signals is explained hereinafter in detail.

Firstly, the control signal generation circuit 20 brings the pre-charge enable signal PC1 into a non-active state (e.g., high potential) in an access period to first SRAM cells (which are described later).

Next, the first word select signals WL11 to WL1$m$ are controlled in such a manner that they have a different voltage level in each of first to third activation periods. The first to third activation periods correspond to three periods obtained by dividing the period during which the first SRAM cells are activated (which is described later) into three sections.

The control signal generation circuit 20 selects one of the word line drivers WDRV11 to WDRV1$m$ in the first activation period. The selected word line driver (e.g., word line driver WDRV11) raises the voltage level of the first word select signal (e.g., first word select signal WL11) from a substrate potential to a predetermined potential at a first rate, and then raises the voltage level from the predetermined potential to a first power supply potential at a second rate lower than the first rate. This difference between the first and second rates is caused by the difference of the current output by the word line driver (e.g., word line driver WDRV11). The first rate is a potential raising rate that is determined by the current drive capability of the word line driver (e.g., word line driver WDRV11). Further, the second rate is a potential raising rate that is determined by the current output by the drive capability control circuit 21, which has a lower current drive capability than that of the word line driver (e.g., word line driver WDRV11). In this embodiment, since the current drive capability of the word line drivers WDRV11 to WDRV1$m$ is set to a value higher than that of the drive capability control circuit 21, the first rate is higher than the second rate. Note that the predetermined potential is a voltage lower than the threshold voltage of the transfer transistor of the first SRAM cells (which is described later).

Note that the period in which the potential rises at the first rate is provided in order to shorten the first activation period. Therefore, the period in which the potential rises at the first rate is not indispensable for a proper operation and thereby can be omitted. In such a case, in the first activation period, the voltage level of the first word select signals WL11 to WL1*m* rises from the substrate potential to the power supply potential at a rate that is determined by a current having a limited maximum current value output by the drive capability control circuit 21 (e.g., second rate).

In the second activation period subsequent to the first activation period, the voltage level of the first word select signals WL11 to WL1*m* is maintained at the power supply potential. Then, in the third activation period subsequent to the second activation period, the voltage level of the first word select signals WL11 to WL1*m* is raised from the power supply potential to the voltage-boosted potential. Note that it is also possible to change the voltage level of the first word select signals WL11 to WL1*m* in the third activation period between in a read operation and in a write operation. For example, the voltage level of the first word select signals WL11 to WL1*m* may be maintained at the power supply potential in the third activation period in a read operation, whereas the voltage level of the first word select signals WL11 to WL1*m* may be raised to the voltage-boosted potential in the third activation period in a write operation.

In order to realize the above-described operation for the first word select signals WL11 to WL1*m*, the control signal generation circuit 20 brings the voltage-boost control signal PE into a non-active state (e.g., low potential), brings the drive capability control circuit 21 into an active state, and brings the voltage-boosted power supply circuit 22 into a non-active state in the first and second activation periods. Further, the control signal generation circuit 20 brings the voltage-boost control signal PE into an active state (e.g., high potential), brings the drive capability control circuit 21 into a non-active state, and brings the voltage-boosted power supply circuit 22 into an active state in the third activation period. Note that the voltage-boost control signal PE is controlled to a non-active state in the periods other than the third activation period.

The control signal generation circuit 20 brings the second word select signals YS11 to YS1*n* into an active state (e.g., high potential) in the third activation period. By doing so, second SRAM cells (which are described later) are electrically connected to the global bit line pairs GBL11 to GBL1*j*.

The control signal generation circuit 20 brings the sense enable signal SE1 into an active state (e.g., high potential) in the latter half of the second activation period. Further, the control signal generation circuit 20 maintains the sense enable signal SE1 in the active state until the pre-charge enable signal PC1 becomes a non-active state. That is, the control signal generation circuit 20 maintains the sense enable signal SE1 in the active state for a longer period than the period in which the voltage-boost control signal PE and the second select signal YS are maintained in an active state. Further, a control cell (which is described later) is activated by the sense enable signal SE1.

Figure 6:
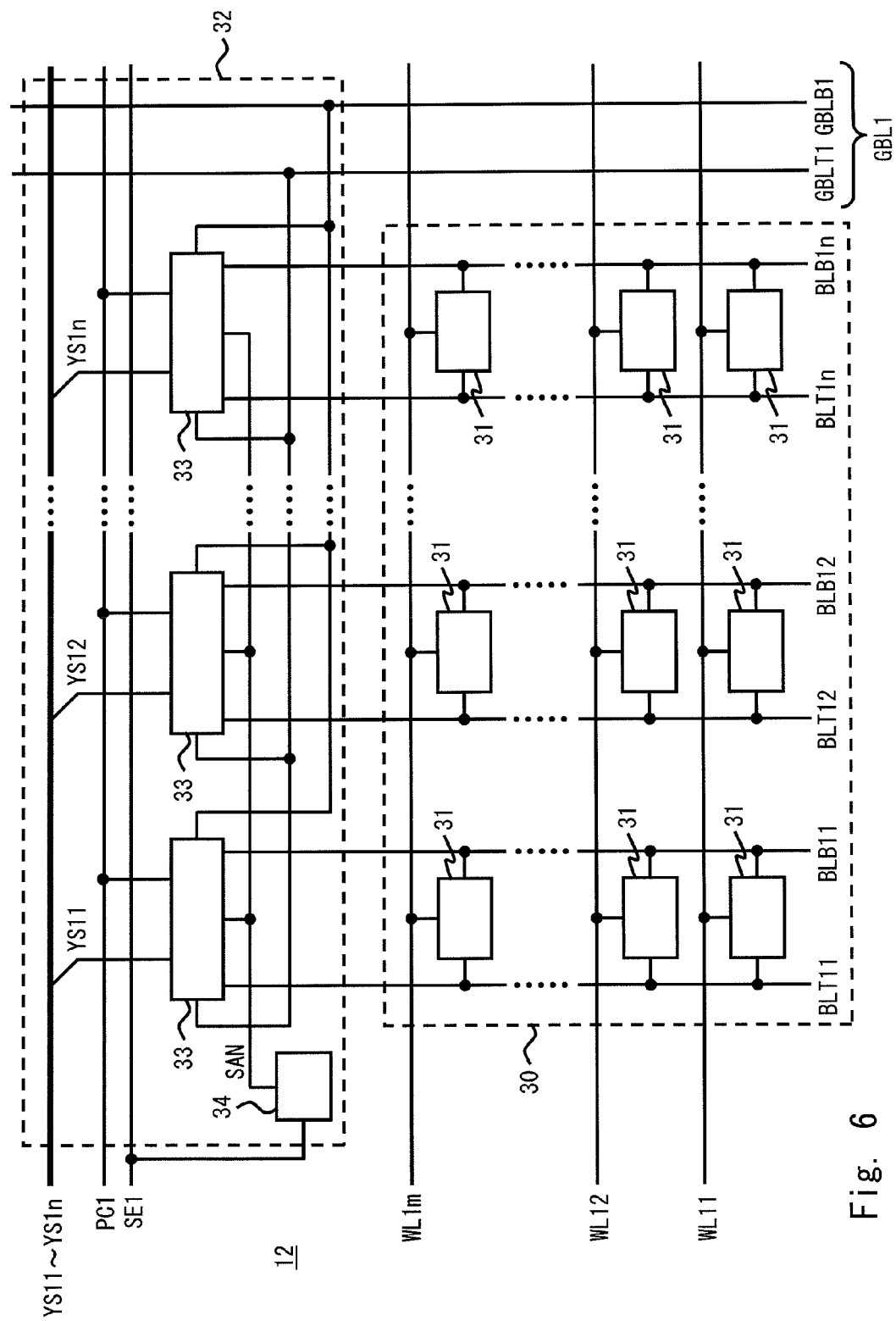
FIG. 6 is a block diagram of an SRAM circuit in accordance with a first embodiment of the present invention.

Next, the SRAM circuits 12 are explained hereinafter in detail. Each of the plurality of SRAM circuits 12 has the same configuration. Therefore, they are explained by using an SRAM circuit 12 that is controlled by the row control signal group WCNT1 and is connected to the global bit line pair GBL1 as an example. Therefore, FIG. 6 shows a block diagram of a SRAM circuit 12. As shown in FIG. 6, the SRAM circuit 12 includes a first SRAM array 30 and a second SRAM array 32.

In the first SRAM array 30, a plurality of first SRAM cells 31 are arranged in a lattice pattern. Further, first SRAM cells 31 that are disposed on the same column are connected to the same first bit line pair (e.g., local bit line pair). Each of the local bit line pairs consists of one of the local bit lines BLT11 to BLT1*n* and a corresponding one of the local bit lines BLB11 to BLB1*n*. Note that the local bit line pairs are provided on a column-by-column basis. For example, the first local bit line pair consists of a local bit line BLT11 and a local bit line BLB11. Further, the same one of the first word select signal WL11 to WL1*m* is supplied to the first SRAM cells 31 disposed on the same row. FIG. 6 shows an example in which the SRAM circuit 12 includes a first SRAM array 30 consisting of m rows and n columns.

Figure 7:
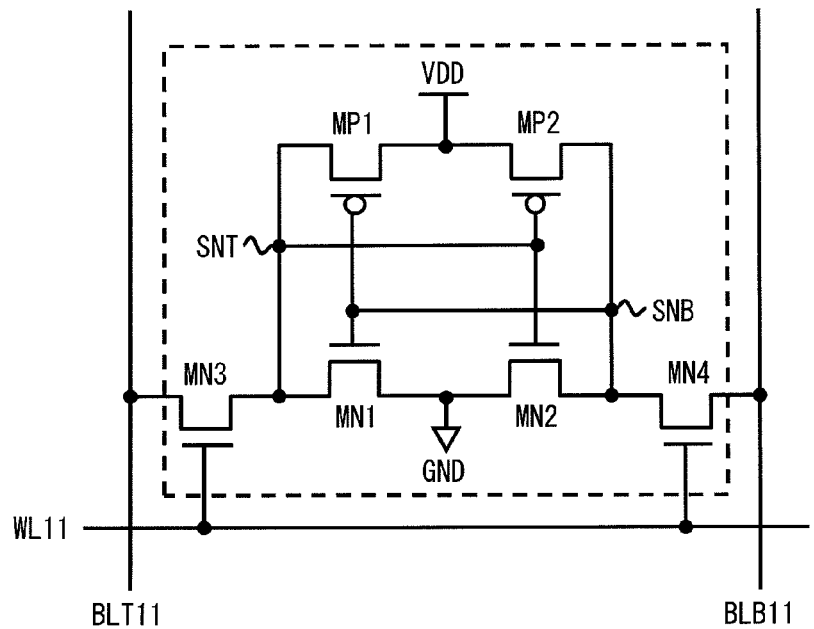
FIG. 7 is a circuit diagram of a first SRAM cell in accordance with a first embodiment of the present invention.

The details of the first SRAM cells 31 are explained hereinafter. Each of the plurality of first SRAM cells 31 has the same circuit configuration. Therefore, in the following explanation, a first SRAM cell 31 which is connected to a local bit line pair consisting of a local bit line BLT11 and a local bit line BLB11 and whose active state is controlled by a first word select signal WL11 is explained as an example. FIG. 7 shows a circuit diagram of a first SRAM cell 31. As shown in FIG. 7, the first SRAM cell 31 includes PMOS transistors MP1 and MP2, and NMOS transistors MN1 to MN4.

The source of the PMOS transistor MP1 is connected to a power supply terminal VDD and the drain is connected to a storage node SNT. The source of the NMOS transistor MN1 is connected to a ground terminal GND and the drain is connected to the storage node SNT. Further, the gates of the PMOS transistor MP1 and the NMOS transistor MN1 are connected to a storage node SNB. The source of the PMOS transistor MP2 is connected to the power supply terminal VDD and the drain is connected to the storage node SNB. The source of the NMOS transistor MN2 is connected to the ground terminal GND and the drain is connected to the storage node SNB. Further, the gates of the PMOS transistor MP2 and the NMOS transistor MN2 are connected to the storage node SNT. One of the source and drain of the NMOS transistor MN3 is connected to the storage node SNT and the other of the source and drain is connected to a local bit line BLT11. One of the source and drain of the NMOS transistor MN4 is connected to the storage node SNB and the other of the source and drain is connected to a local bit line BLB11. Further, a first word select signal WL11 is input to the gates of the NMOS transistors MN3 and MN4.

Note that in the first SRAM cell 31 shown in FIG. 7, the PMOS transistors MP1 and MP2 function as load transistors in the SRAM cell, and the NMOS transistors MN1 and MN2 function as drive transistors in the SRAM cell. Further, the NMOS transistors MN3 and MN4 function as transfer transistors in the SRAM cell.

Further, the NMOS transistor MN1 and the PMOS transistor MP1 form one of the CMOS inverter circuits. Meanwhile, the NMOS transistor MN2 and the PMOS transistor MP2 form the other of the CMOS inverter circuits. That is, the On/Off of the current flowing between the sources and the drains of the NMOS transistor MN1 and the PMOS transistor MP1 is controlled based on a signal input to the gates of the NMOS transistor MN1 and the PMOS transistor MP1, so that the first SRAM cell 31 outputs an inverting signal of an input signal to the storage node SNT. Further, the storage node SNT is connected to the gates of the NMOS transistor MN2 and the PMOS transistor MP2. Therefore, the On/Off of the current flowing between the sources and the drains of the NMOS transistor MN2 and the PMOS transistor MP2 is controlled based on a signal input to the gates of the NMOS transistor MN2 and the PMOS transistor MP2, so that mutually inverted signals are generated at the storage nodes SNT and SNB. In this way, the first SRAM cell 31 includes two CMOS inverters connected in a loop form, and holds the voltage level of the stored signal (hereinafter referred to as "storage data"). Further, read and write operations of storage data are performed by controlling the On/Off of the current flowing between the source and the drain of the NMOS transistor MN3 and the NMOS transistor MN4.

Next, the second SRAM array 32 is explained. The second SRAM array 32 includes a plurality of second SRAM cells 33 and a control cell 34. The second SRAM cells 33 are provided so as to correspond to the local bit line pairs of the first SRAM array 30. Further, each of the second SRAM cells 33 amplifies and stores a potential difference between read signals output to a corresponding local bit line pair. Each of the second word select signals YS11 to YS1*n* is input to a corresponding one of the second SRAM cell 33. Further, when one of the second word select signals YS11 to YS1*n* becomes an active state (e.g., high potential), the corresponding one of the second SRAM cell 33 becomes an active state. In a read operation, when a second SRAM cell 33 becomes an active state, it outputs the storage data to a global bit line pair GBL1. Further, in a write operation, when a second SRAM cell 33 becomes an active state, it electrically connects the global bit line pair GBL1 to a corresponding local bit line pair. Further, the pre-charge enable signal PC1 is input to the second SRAM cells 33. Then, in the second SRAM cells 33, a corresponding local bit line pair is pre-charged to the power supply potential during a period in which the pre-charge enable signal PC1 is in an active state (e.g., low potential). Further, a second SRAM cell 33 amplifies and stores a potential difference between the corresponding local bit line pair during a period in which the pre-charge enable signal PC1 is in a non-active state (e.g., high potential).

Figure 8:
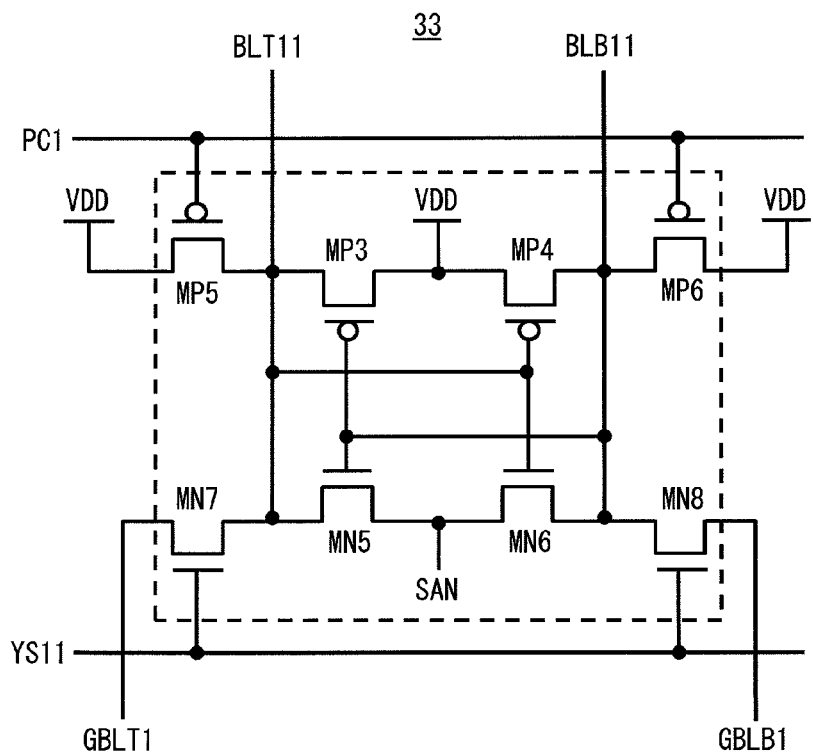
FIG. 8 is a circuit diagram of a second SRAM cell in accordance with a first embodiment of the present invention.

The details of the second SRAM cell 33 are explained hereinafter. Each of the second SRAM cells 33 has the same circuit configuration. Therefore, they are explained by using a second SRAM cell 33 that is connected to a local bit line pair consisting of a local bit line BLT11 and a local bit line BLB11 as an example. FIG. 8 shows a circuit diagram of a second SRAM cell 33. As shown in FIG. 8, the second SRAM cell 33 includes PMOS transistors MP3 to MP6 and NMOS transistors MN5 to MN8.

The source of the PMOS transistor MP3 is connected to a power supply terminal VDD and the drain is connected to a local bit line BLT11. An amplification control signal SAN is input to the source of the NMOS transistor MN5, and the drain of the NMOS transistor MN5 is connected to the local bit line BLT11. Further, the gates of the PMOS transistor MP3 and the NMOS transistor MN5 are connected to a local bit line BLB11. The source of the PMOS transistor MP4 is connected to the power supply terminal VDD and the drain is connected to the local bit line BLB11. The amplification control signal SAN is input to the source of the NMOS transistor MN6, and the drain of the NMOS transistor MN6 is connected to the local bit line BLB11. Further, the gates of the PMOS transistor MP4 and the NMOS transistor MN6 are connected to the local bit line BLT11. One of the source and drain of the NMOS transistor MN7 is connected to the local bit line BLT11 and the other of the source and drain is connected to a global bit line GBLT1. One of the source and drain of the NMOS transistor MN8 is connected to the local bit line BLB11 and the other of the source and drain is connected to a global bit line GBLB1. Further, a second word select signal YS11 is input to the gates of the NMOS transistors MN7 and MN8. The drain of the PMOS transistor MP5 is connected to the local bit line BLT11 and the source is connected to the power supply terminal VDD. The drain of the PMOS transistor MP6 is connected to the local bit line BLB11 and the source is connected to the power supply terminal VDD. Further, a pre-charge enable signal PC1 is input to the gates of the PMOS transistors MP5 and MP6.

Figure 9:
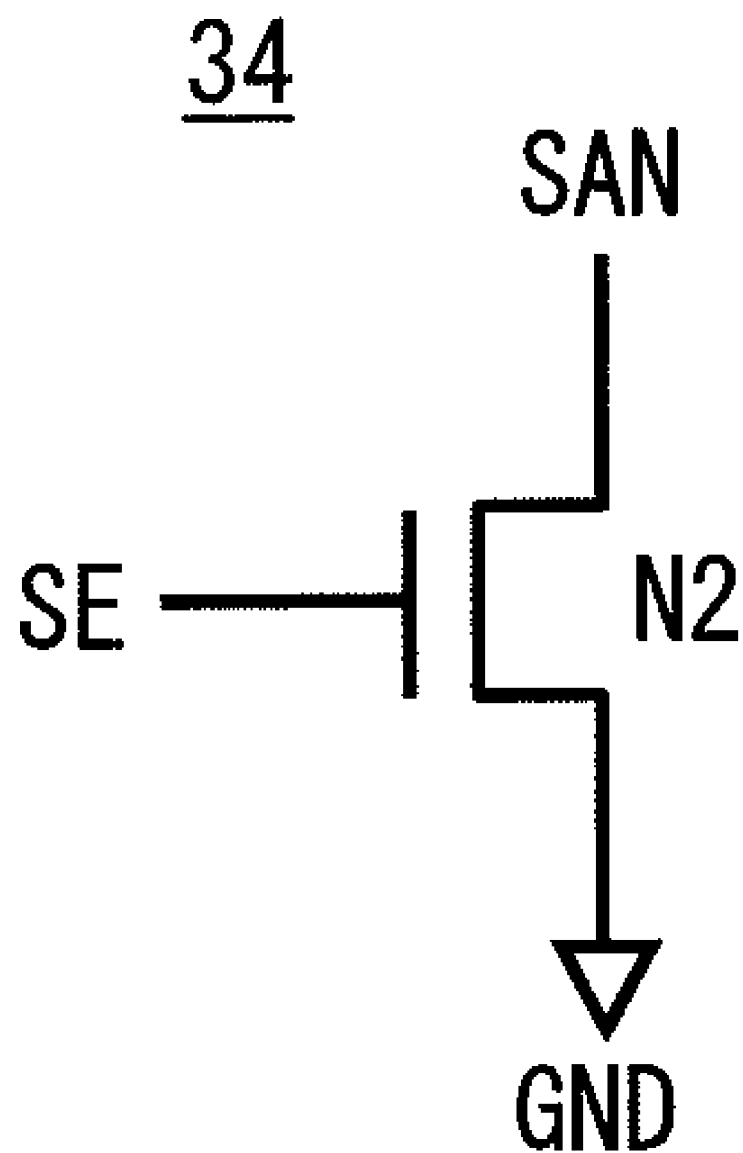
FIG. 9 is a block diagram of a control cell in accordance with a first embodiment of the present invention.

One control cell 34 is provided for a plurality of second SRAM cells 33. The control cell 34 controls the amplification function of the plurality of second SRAM cells 33. FIG. 9 shows a circuit diagram of the control cell 34. As shown in FIG. 9, the control cell 34 includes an NMOS transistor N2. The source of the NMOS transistor N2 is connected to a ground terminal GND, and a sense enable signal SE1 is input to the gate of the NMOS transistor N2. Further, the NMOS transistor N2 outputs an amplification control signal SAN from its drain. That is, when the sense enable signal SE1 indicates an active state (e.g., high potential), the control cell 34 becomes an active state, outputs a ground potential as the amplification control signal SAN, and enables the amplification function of the second SRAM cells 33. On the other hand, when the sense enable signal SE1 indicates a non-active state (e.g., low potential), the control cell 34 becomes a non-active state. Therefore, the amplification control signal SAN becomes an unknown state, and the amplification function of the second SRAM cells 33 is disabled.

With the above-described configuration, in the second SRAM array 32, when the pre-charge enable signal PC1 is in an active state (e.g., low potential) in a state where the amplification function of the second SRAM cell 33 is disabled by the control cell 34, the PMOS transistors MP5 and MP6 are turned on. Then, a power supply potential is supplied to the second storage node pair of the second SRAM cell 33, i.e., to the first bit lines BLT11 and BLB11. Therefore, at this point, the second SRAM cell 33 exhibits an unknown state where no storage data is held, and the first bit lines BLT11 and BLB11 are pre-charged to the power supply potential.

Further, when the pre-charge enable signal PC1 is in a non-active state (e.g., high potential), the PMOS transistors MP5 and MP6 are turned off. Further, in this case, if the NMOS transistor N2 of the control cell 34 is in an off-state, no current flows between the source and the drain of the NMOS transistor N2. Therefore, since the voltage between the source of the NMOS transistor MN5 and the source of the NMOS transistor MN6 is not fixed at the ground voltage GND, the second SRAM cell 33 exhibits an unknown state where no storage data is held.

Further, when the pre-charge enable signal PC1 is in a non-active state (e.g., high potential) and the sense enable signal SE1 becomes an active state (e.g., low potential), the NMOS transistor N2 of the control cell 34 is turned on and the amplification control signal SAN indicates the ground voltage GND. Therefore, the second SRAM cell 33 amplifies a potential difference between read signals output to the corresponding local bit line pair (BLT11 and BLB11), and holds the storage data as in the case of the first SRAM cell 31. Then, read and write operations of storage data are performed by controlling the On/Off of the current flowing between the source and the drain of the NMOS transistors MN7 and MN8.

Figure 10:
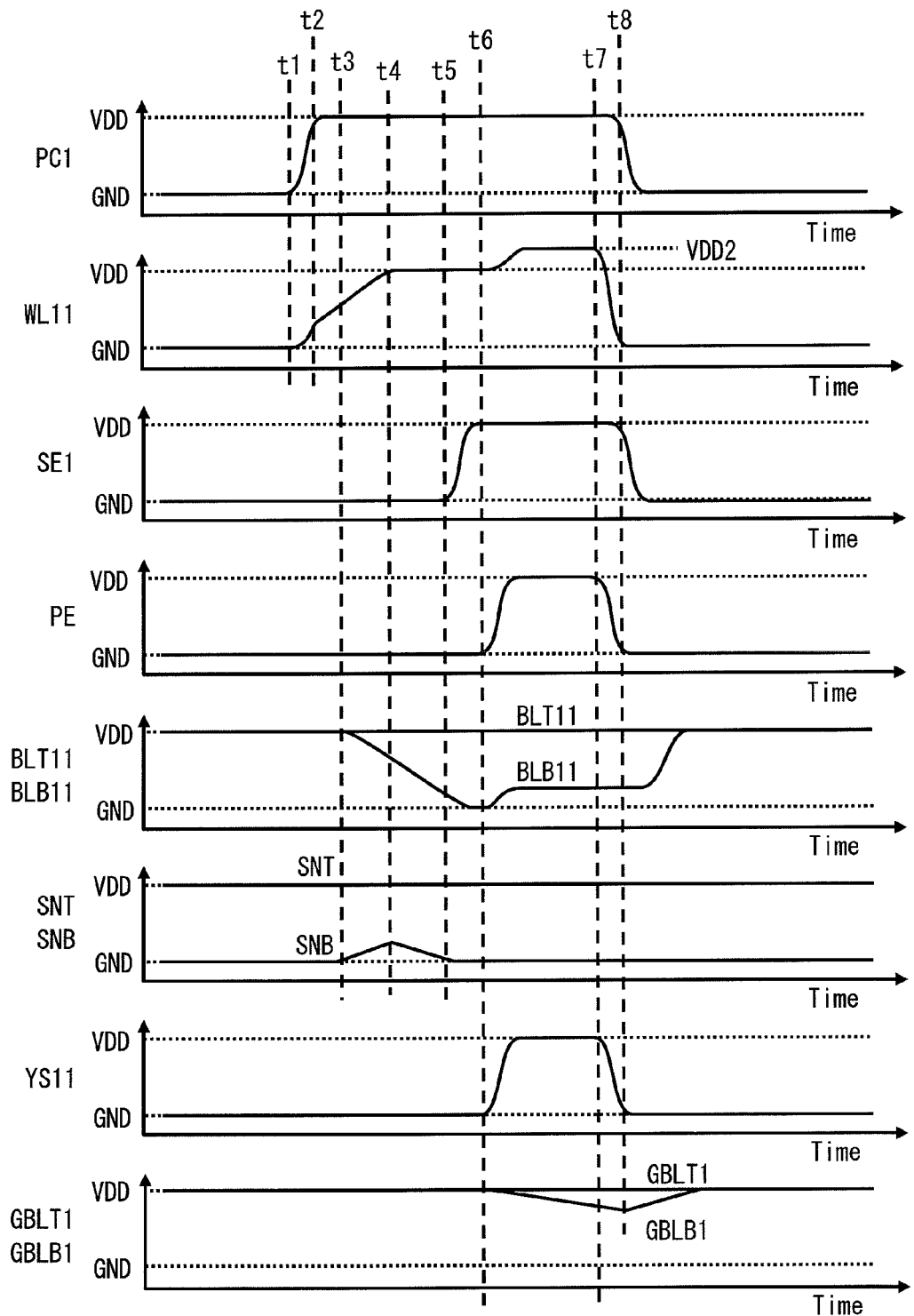
FIG. 10 is a timing chart showing a data read operation from a SRAM cell having a deteriorated static noise margin characteristic in a semiconductor storage device in accordance with a first embodiment of the present invention.
Figure 11:
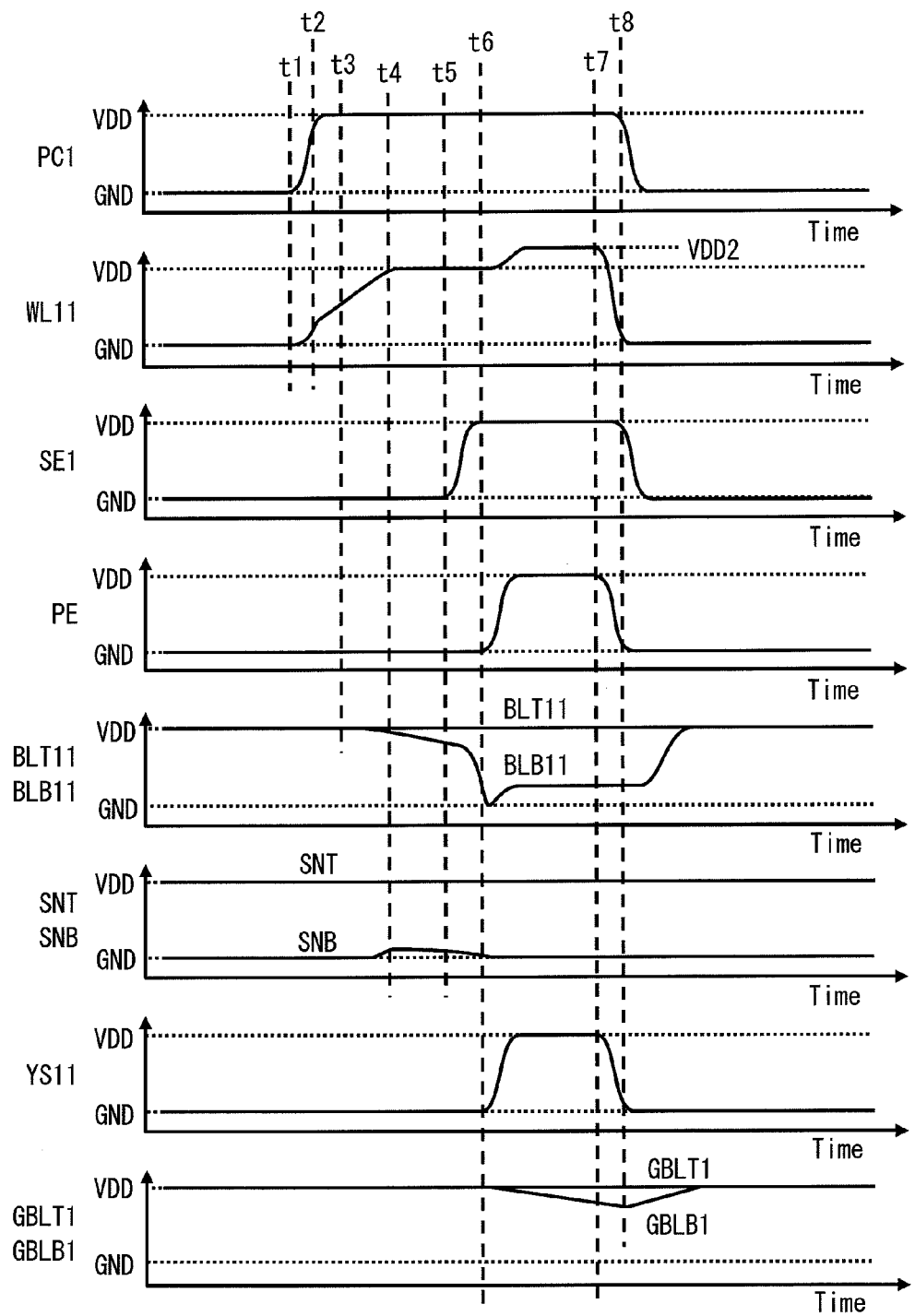
FIG. 11 is a timing chart showing a data read operation from a SRAM cell having a deteriorated cell current characteristic in a semiconductor storage device in accordance with a first embodiment of the present invention.
Figure 12:
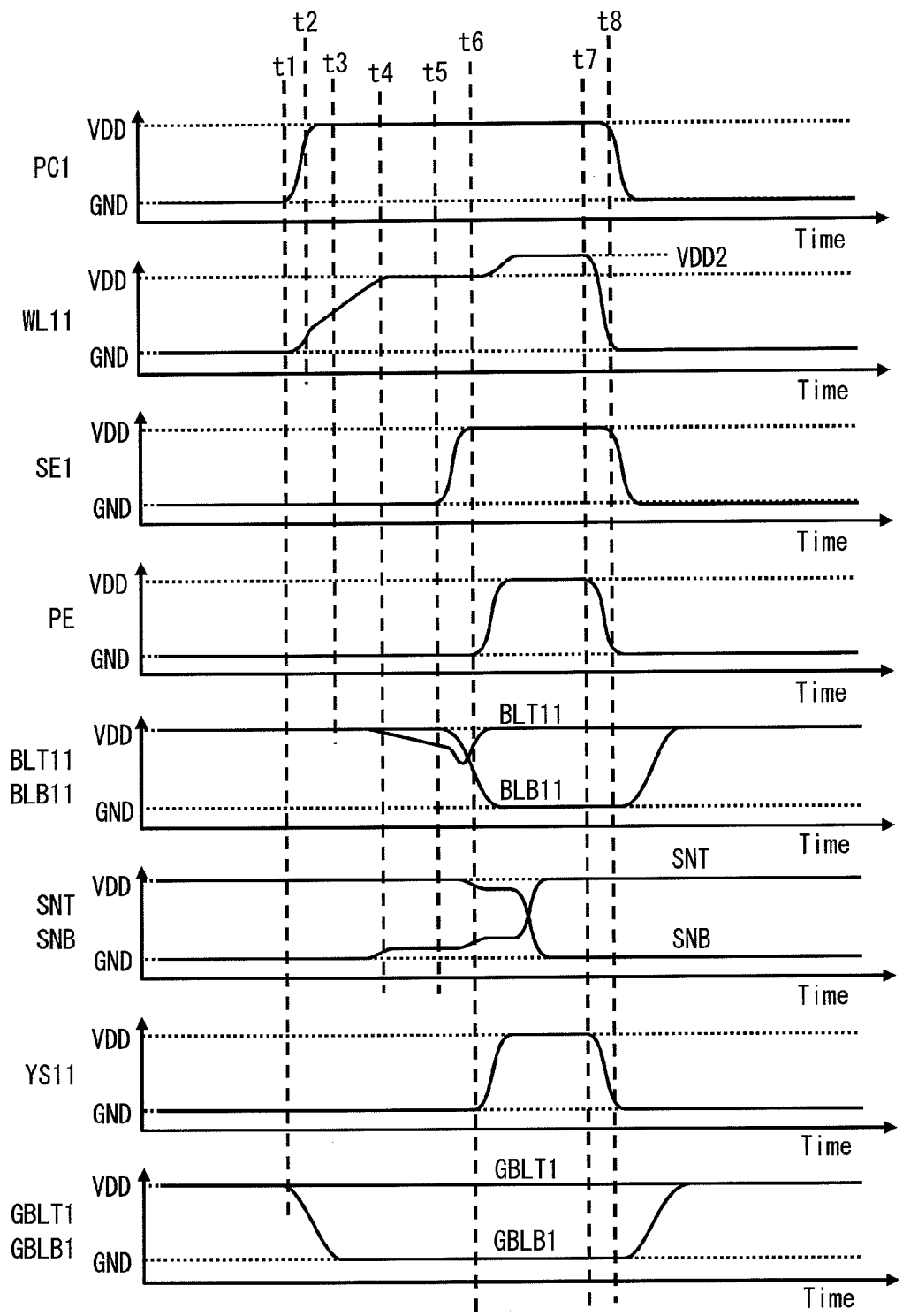
FIG. 12 is a timing chart showing a data write operation to a SRAM cell in a semiconductor storage device in accordance with a first embodiment of the present invention.

Next, an operation of a semiconductor storage device in accordance with the first embodiment is explained. Therefore, FIGS. 10 to 12 show timing charts showing operations of the semiconductor storage device. The timing charts shown in FIGS. 10 and 11 show read operations, and the timing chart shown in FIG. 12 shows a write operation. Further, in SRAM cells, examples of cells in which the possibility of the occurrence of malfunctions such as corruption of stored data in read operations (including pseudo-read operations in write operations) is relatively high include cells having a small static noise margin and cells having a small cell current. Therefore, FIG. 10 shows a timing chart in a case where a read operation is performed on an SRAM cell having a small static noise margin, and FIG. 11 shows a timing chart in a case where a read operation is performed on an SRAM cell having a small cell current. Further, FIG. 12 shows a timing chart in a case where a write operation is performed on an SRAM cell to which data cannot be easily written.

Note that in FIGS. 10 to 12, examples in which a read operation or a write operation is performed on a first SRAM cell 31 that is connected to a local bit line pair consisting of a local bit line BLT11 and a local bit line BLB11 and is controlled by a first word select signal WL11 are explained. Further, an assumption is made in the operation examples shown in FIGS. 10 to 12 that the semiconductor storage device 1 in accordance with this embodiment performs the same operation for the pre-charge enable signal PC1, the sense enable signal SE1, the first word select signal WL11, the voltage-boost control signal PE, and the second word select signal YS11 in a read operation and a write operation. Therefore, the operation timing of each of these control signals is explained in the explanation made with reference to FIG. 10, and the explanation of the operation timing of these control signals is omitted in the explanation made with reference to FIGS. 11 and 12.

Firstly, an operation shown in FIG. 10 is explained. As shown in FIG. 10, before a timing t1, the semiconductor storage device 1 is in a standby state in which the pre-charge enable signal PC1 is in an active state (e.g., low potential) and the pair of local bit lines BLT11 and BLB11 is pre-charged to the power supply potential. Further, all of the first word select signal WL11, the sense enable signal SE1, the voltage-boost control signal PE, and the second word select signal YS11 are at a low level, i.e., in a non-active state (e.g., low potential). Further, in the example shown in FIG. 10, before the timing t1, the first SRAM cell 31 exhibits a state in which a high potential is stored in the storage node SNT and a low potential is stored in the storage node SNB (i.e., state in which "1" is stored as the storage data).

Then, at the timing t1, the word line control circuit 10 changes the pre-charge enable signal PC1 from the active state (e.g., low potential) to a non-active state (e.g., high potential), and by doing so, starts a read operation. Further, the word line control circuit 10 also starts to raise the first word select signal WL11 in addition to the operation for the pre-charge enable signal PC1. Note that the period from the timing t1 to t4 becomes the first activation period in the first word select signal WL11.

In this first activation period, an electrical charge accumulated in the capacitor C1 of the voltage-boosted power supply circuit 22 flows into the word line through the PMOS transistor P1 of the word line driver WDRV11 of the word line control circuit 10 in the period from the timing t1 to t2. Therefore, the first word select signal WL11 rises at a first rate in the first activation period. This first rate is higher than a second rate at which the potential of the first word select signal WL11 rises after the timing t2.

Then, after the first word select signal WL11 rises to a predetermined potential at the timing t2, the word line driver WDRV11 raises the voltage level of the first word select signal WL11 with an output current whose current value is limited by the drive capability control circuit 21. This predetermined potential is a potential lower than the threshold voltage of the transfer transistors (NMOS transistors MN3 and MN4) of the first SRAM cell 31. Further, the predetermined potential is determined by the amount of electrical charge accumulated in the capacitor C1 before the timing t1, the parasitic capacitance of the word line, and the gate parasitic capacitance of the transfer transistors. Further, in the period from the timing t2 to t4, the first word select signal WL11 rises to the power supply potential at the second rate.

Further, while the potential level of the first word select signal WL11 rises in the period from the timing t2 to t4 at the second rate according to the current drive capability of the drive capability control circuit 21, it reaches to a potential level at which the transfer transistor MN4 is turned on at a timing t3. Therefore, "low potential" stored in the storage node SNB is output to the local bit line BLB11 at the timing t3. As a result, a potential difference between the local bit lines BLT11 and BLB11 starts to increase.

Then, the potential level of the first word select signal WL11 reaches the power supply potential at the timing t4. At this timing t4, the potential level between the pair of local bit lines BLT11 and BLB11 has sufficiently increased, thereby preventing the corruption of the data stored in the first SRAM. That is, in the semiconductor storage device 1, the first word select signal WL11 having a potential lower than the power supply potential of the first SRAM cell 31 is applied to the transfer transistors at the start time point of the storage data read operation from the first SRAM cell 31 (i.e., at timing t3). Therefore, it is possible to sufficiently increase the potential difference between the local bit lines BLT11 and BLB11 at the timing t4 at which the potential level of the first word select signal WL11 reaches the power supply potential. Accordingly, in the semiconductor storage device 1, it is possible to prevent the corruption of data stored in a SRAM cell having a small static noise margin.

The period from the timing t4 to t6 becomes the second activation period in the first word select signal WL11. After the first word select signal WL11 reaches the power supply potential at the timing t4, the word line control circuit 10 maintains the first word select signal WL11 at the power supply potential during the second activation period. Further, the word line control circuit 10 brings the sense enable signal SE1 into an active state (e.g., high potential) at a timing t5 in the latter half of the second activation period. The timing at which the sense enable signal SE1 is changed to the active state is preferably located in the latter half of the second activation period in order to prevent the data corruption in an SRAM cell having a small cell current (which is explained later with reference to FIG. 11). However, this timing may be any timing within the second activation period. Then, since the sense enable signal SE1 becomes the active state, the control cell 34 changes to an active state and provides an amplification control signal SAN having a ground potential to the second SRAM cells 33. Further, the amplification function of the second SRAM cells 33 is enabled based on this amplification control signal SAN. Therefore, the second SRAM cell 33 amplifies the potential difference between the local bit lines BLT11 and BLB11 and holds the storage data stored in the first SRAM cell 31.

Next, the period from the timing t6 to t7 becomes the third activation period in the first word select signal WL11. At the timing t6, the word line control circuit 10 brings the voltage-boost control signal PE and the second word select signal YS11 into an active state (e.g., high potential). Then, the drive capability control circuit 21 becomes a non-active state based on the voltage-boost control signal PE, and the voltage-boosted power supply circuit 22 becomes an active state. Therefore, in the voltage-boosted power supply circuit 22, the potential at one end of the capacitor C1 becomes the power supply potential and the electrical charge accumulated in the capacitor C1 flows into the word line through the PMOS transistor P1 of the word line driver WDRV11. As a result, the first word select signal WL11 is raised from the power supply potential to the voltage-boosted potential (VDD2 in FIG. 10). Further, since the second word select signal YS11 becomes the active state, the second SRAM cell 33 becomes an active state and thereby outputs the storage data stored in the cell to the global bit line pair GBL1. Then, the potential difference between the global bit line pair GBL1 increases. Further, the sense amplification circuit SA amplifies the potential difference between the global bit line pair GBL1 even further and externally outputs the storage data held in the first SRAM cell 31.

Next, at the timing t7, the word line control circuit 10 retunes the potential level of the first word select signal WL11 to the substrate potential (non-active state). As a result, the transfer transistors of the first SRAM cell 31 are turned off, and the first SRAM cell 31 holds the storage data stored in the storage nodes SNT and SNB. Further, in response to the change of the first word select signal WL11 to the non-active state, the voltage-boost control signal PE and the second word select signal YS11 are also changed to a non-active state. Then, in response to the voltage-boost control signal PE, the drive capability control circuit 21 changes to an active state and the voltage-boosted power supply circuit 22 stops the voltage-boost operation. Further, in response to the second word select signal YS11, the second SRAM cell 33 changes to a non-active state.

Next, at a timing t8, the pre-charge enable signal PC1 is changed to an active state (low potential). With this change, the read operation for the first SRAM cell 31 has completed. Further, since the pre-charge enable signal PC1 becomes the active state (low potential), the local bit lines BLT11 and BLB11 are pre-charged to the power supply potential.

Next, an operation shown in FIG. 11 is explained. The operations performed in the period from the timing t3 to t5 in the timing chart shown in FIG. 11 are the same as those shown in FIG. 10 except for the operation for the local bit lines BLT11 and BLB11. Therefore, explanation for the same operations as those of FIG. 10 is omitted here.

In an operation example shown in FIG. 11, the first SRAM cell 31 has a lower cell current capability than that of an ordinary first SRAM cell 31. Note that the term "cell current capability" means the capability of a first SRAM cell to draw an electrical charge from a local bit line pair.

In the operation example shown in FIG. 10, since the cell current is large, the potential difference between the local bit lines BLT11 and BLB11 starts to increase at the timing t3 at which the potential level of the first word select signal WL11 is low. However, in FIG. 11, since the cell current capability is low, the potential difference between the local bit lines BLT11 and BLB11 hardly changes in the period from the timing t3 to t4. Then, when the potential level of the first word select signal WL11 increases sufficiently at the timing t4, the transfer transistors of the first SRAM cell 31 are sufficiently turned on and the potential difference between the local bit lines BLT11 and BLB11 starts to increase gradually.

Then, at the timing t5, the sense enable signal SE1 is brought into an active state. As a result, the control cell 34 outputs the ground potential as the amplification control signal SAN and the amplification function of the second SRAM cell 33 is enabled. Then, the second SRAM cell 33 amplifies the potential difference between the pair of local bit lines BLT11 and BLB11 and holds the storage data stored in the first SRAM cell 31. That is, the timing t5 is preferably a timing at which the potential difference between the local bit lines BLT11 and BLB11 has increased to such a level that the amplifying operation of the second SRAM cell 33 works effectively in a first SRAM cell 31 having a small cell current.

Next, an operation shown in FIG. 12 is explained. The timing chart shown in FIG. 12 shows a write operation to a first SRAM cell 31. This write operation is the same as those shown in FIGS. 10 and 11 except for the changes in the potential levels of the global bit line pair GBL1, the local bit lines BLT11 and BLB11, and the storage nodes SNT and SNB. Therefore, the following explanation is made with a particular emphasis on the changes in the potential levels of the global bit line pair GBL1, the pair of local bit lines BLT11 and BLB11, and the storage nodes SNT and SNB.

Firstly, in a write operation, at a timing t1 at which the pre-charge enable signal PC1 changes to a non-active state (high potential), the write control circuit WA drives the global bit line pair GBL1. As a result, the potential difference between the global bit line pair GBL1 increases.

Then, in a period from a timing t3 to t5, the storage data is output from the first SRAM cell 31 to the pair of local bit lines BLT11 and BLB11. In this period, as explained above with reference to FIGS. 10 and 11, the semiconductor storage device 1 can output storage data to the pair of local bit lines BLT11 and BLB11 with stability even when the storage data is stored in an SRAM cell having a small static noise margin or a small cell current.

Then, at a timing t6, the voltage-boost control signal PE is activated. As a result, the potential level of the first word select signal WL11 rises from the power supply potential to the voltage-boosted potential. By supplying this voltage-boosted potential, the transfer transistors of the first SRAM cell 31 can ensure the sufficient conductive state even if the voltage of the local bit lines BLT11 and BLB11 is the power supply potential. That is, it is possible to realize a stable data write operation, even for an SRAM cell having a deteriorated data writing characteristic, by using the voltage-boosted potential.

Further, at the timing t6, the second word select signal YS11 is activated. As a result, the NMOS transistors MN7 and MN8 of the second SRAM cell 33 become a conductive state and electrically connect the global bit line pair GBL1 to the pair of local bit lines BLT11 and BLB11. Then, the high potential of the global bit line GBLT1 propagates to the local bit line BLT11 and the low potential of the global bit line GBLB1 propagates to the local bit line BLB11.

At this point, since the second SRAM cell 33 is in an active state, it amplifies and holds the potential difference provided through the NMOS transistors MN7 and MN8. That is, the second SRAM cell 33 has a function as a local write control circuit that controls the write operation for the first SRAM cell 31. Then, the high potential and the low potential are, respectively, written into the storage nodes SNT and SNB connected to the local bit lines BLT11 and BLB11.

Then, since the second word select signal YS11 and the first word select signal WL11 become a non-active state at a timing t7, the storage nodes SNT and SNB are disconnected from the global bit line pair GBL1 and the pair of the local bit lines BLT11 and BLB11, and they become a data holding state.

As described above, in the semiconductor storage device 1 in accordance with the first embodiment, the first word select signal WL11, which is used to control the activation of the first SRAM cell 31, is controlled in three voltage levels. Specifically, in the first activation period, the potential level of the first word select signal WL11 is raised based on a limited current generated by the drive capability control circuit 21 having a drive capability lower than that of the word line driver WDRV11. As a result, in the first activation period, the first word select signal WL11 rises at the second rate that is lower than the ordinary signal raising rate. Further, a potential lower than the power supply potential is supplied to the transfer transistors of the first SRAM cell 31 in a pseudo manner. Further, in the second activation period, the first word select signal WL11 is maintained at the power supply potential. Further, in the third activation period, a potential of the first word select signal WL11 is obtained by raising the power supply potential by an electrical charge accumulated in the capacitor C1. Therefore, in the semiconductor storage device 1, it is possible to generate a first word select signal WL having three different potential levels by using one power supply. That is, the semiconductor storage device 1 does not require a plurality of power supplies to generate three potential levels, and therefore the circuit area corresponding to the power supply circuit can be reduced.

Note that the semiconductor storage device 1 includes the drive capability control circuit 21 and the voltage-boosted power supply circuit 22. However, only one drive capability control circuit 21 and only one voltage-boosted power supply circuit 22 need to be provided for a plurality of word line drivers WDRV. In addition, each of these circuits can be formed from a very small number of circuit elements. Therefore, the increase of the circuit area due to the addition of the drive capability control circuit 21 and the voltage-boosted power supply circuit 22 is substantially negligible.

Further, in the semiconductor storage device 1, an access delay time occurs to raise the first word select signal WL11 in the first activation period. However, the power supply voltage VDD, which is higher than the voltage in the related-art example shown in K. Zhang, et al., "A 3-GHz 70 Mb SRAM in 65 nm CMOS Technology with Integrated Column-Based Dynamic Power Supply," ISSCC2005, can be applied to the word line of the first SRAM cell 31 in the second activation period. Therefore, the control time of the second activation period can be significantly shortened. As a result, the access delay time that is determined based on the total time of the first and second activation periods does not increase.

Further, in the semiconductor storage device 1, since the word line can be quickly charged by using the electrical charge accumulated in the capacitor C1 in the voltage-boosted power supply circuit 22 in the first activation period, the initial rising time of the first word select signal WL11 can be shortened.

Further, in the semiconductor storage device 1, the first word select signal WL11 is also raised to the voltage-boosted potential through the first and second activation periods even in a write operation. Therefore, even when the boosted voltage is applied to the first SRAM cell 31 in the third activation period, the semiconductor storage device 1 can hold storage data of a first SRAM cell 31, into which new data is to be written, in the second SRAM cell 33 while preventing the corruption of storage data of a first SRAM cell 31, into which no new data is to be written. In this way, the semiconductor storage device 1 can improve the reliability of storage data held in the first SRAM cell 31 into which no data is to be written.

Further, although the third activation period is added in the operation cycle, the control of the word line in the third activation period in a read operation is performed at the same time as the operation in which the read data is output from the second SRAM cell 33 to the sense amplification circuit SE. As a result, the cycle time does not increase.

Note that the present invention is not limited to the above-described embodiments, and various modifications can be made without departing from the spirit and scope of the present invention.

For example, although the SRAM circuit 12 show in FIG. 6 has such a configuration that one control cell 34 controls n second SRAM cells 33, it is also possible to adopt different circuit configurations in which a plurality of control cells 34 control n second SRAM cells 33. Specifically, in a case where two control cells 34 are provided, n second SRAM cells 33 is divided into two groups. Then, each of the two control cells 34 controls n/2 second SRAM cells 33. Further, in a case where n control cells 34 are provided, each of the control cells 34 controls a corresponding one of the second SRAM cells 33.

Further, although FIG. 6 shows an example of the SRAM circuit 12 in which n second SRAM cells 33 are connected to one global bit line pair GBL1, it is also possible to adopt such a configuration that a plurality of global bit line pairs are connected to one SRAM circuit 12. For example, in a case where two global bit line pairs are connected one SRAM circuit 12, n/2 second SRAM cells 31 are connected to one global bit line pair. By using the circuit configuration like this, it is possible to reduce the parasitic capacitance of the global bit line pair and thereby to increase the operating speed. Note that when a plurality of global bit line pairs are provided, a bit line pair selector SEL is used to select one of the global bit line pairs according to the column address. Further, by connecting a plurality of global bit line pairs that are connected to a plurality of SRAM circuits 12 to one bit line pair selector SEL, it is possible to increase the number of column addresses to or above n without increasing the number of the second word select signals YS11 to YS1n from n.

Figure 13:
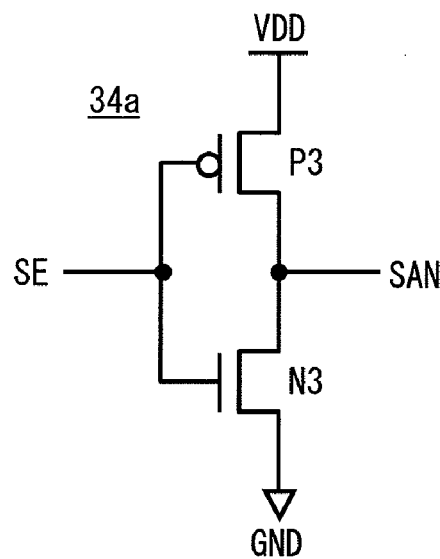
FIG. 13 is a circuit diagram showing another example of a control cell in accordance with a first embodiment of the present invention.

Further, as for the control cell 34, a control cell 34a shown in FIG. 13 can be used instead of the configuration shown in FIG. 9. The control cell 34a shown in FIG. 13 forms an inverter by a PMOS transistor P3 and an NMOS transistor N3. Further, when the sense enable signal SE1 indicates an active state (e.g., high potential), the control cell 34a outputs a ground potential as the amplification control signal SAN, whereas when the sense enable signal SE1 indicates a non-active state (e.g., low potential), the control cell 34a outputs a power supply potential as the amplification control signal SAN With this configuration, even in a state where the amplification function of the second SRAM cell 33 is disabled by the control cell 34a, the sources of the NMOS transistors MN5 and MN6 do not become an unknown state. Therefore, it is possible to stabilize the circuit operation of the second SRAM cells 33.

Figure 14:
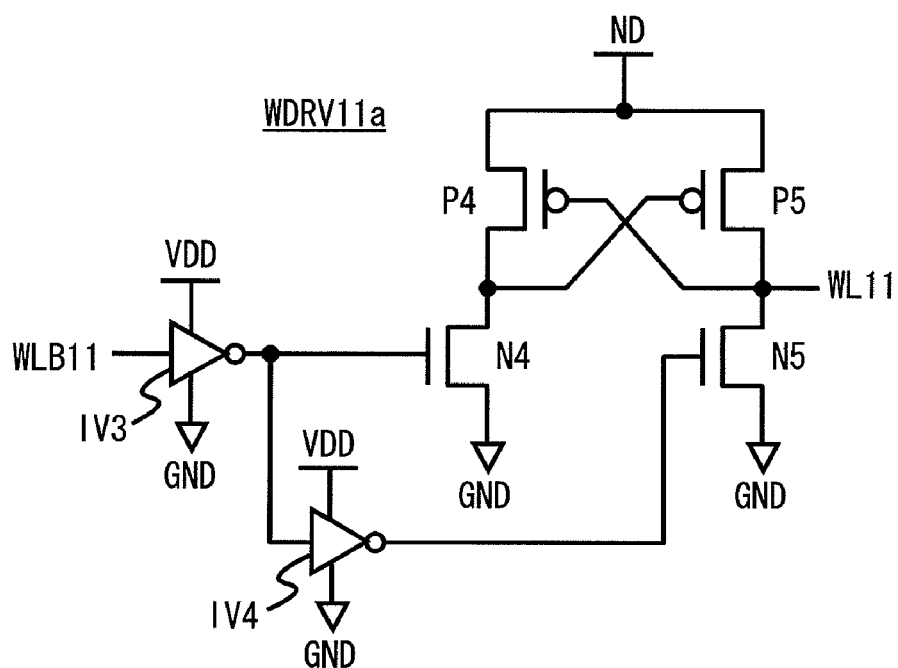
FIG. 14 is a circuit diagram showing another example of word line driver in accordance with a first embodiment of the present invention.

Further, a word line driver WDRV11a shown in FIG. 14 can be used in place of the word line driver WDRV11 shown in FIG. 3. The word line driver WDRV11a is a level conversion circuit having an inverting function, and includes NMOS transistors N4 and N5, PMOS transistors P4 and P5, and inverters IV3 and IV4. In the word line driver WDRV11 shown in FIG. 3, there is a possibility that an electrical charge flows into the ground terminal GND through the PMOS transistor P1 of the word line driver in a non-active state and the potential of the word line signal WL11 is thereby lowered from the voltage-boosted potential. However, the use of the word line driver WDRV11a can prevent the decrease in the potential of the word like signal WL11 like this.

Further, in FIGS. 10 and 11, the first word select signal WL11 is raised to the voltage-boosted potential even in the read operation. However, it is possible to stop the voltage-boost control signal PE in the read operation and thereby to maintain the first word select signal WL11 at the power supply potential in the third activation period.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor storage device comprising:
a plurality of first SRAM cells that store data, the plurality of first SRAM cells being arranged in a lattice pattern;
a plurality of first bit line pairs provided along first SRAM cells arranged in a column direction;
a plurality of second SRAM cells each provided for one of the first bit line pairs, each of the plurality of second SRAM cells being configured to amplify and store a potential difference between read signals output to a corresponding one of the first bit line pairs;
a control cell that controls an amplification function of the plurality of second SRAM cells;
at least one second bit line pair provided in the plurality of second SRAM cells;
a word line control circuit that outputs a first control signal used to activate first SRAM cells arranged on a row selected by a row address in the plurality of first SRAM cells, a second control signal used to activate a second SRAM cell selected by a column address in the plurality of second SRAM cells, and a third control signal used to activate the control cell;
a plurality of word lines provided along first SRAM cells arranged in a row direction, the plurality of word lines being configured to transmit the first control signal;
a sense amplification circuit that amplifies a potential difference between read signals output from a second SRAM cell activated based on the second control signal to the second bit line pair; and
a write control circuit that outputs a write signal to the second SRAM cell activated based on the second control signal through the second bit line pair,
wherein the word line control circuit:
in a first activation period, raises a voltage level of the first control signal from a substrate potential to a predetermined potential at a first rate, and then raises the voltage level from the predetermined potential to a first power supply potential at a second rate lower than the first rate;
in a second activation period subsequent to the first activation period, maintains the voltage level of the first control signal at the first power supply potential; and
in a third activation period subsequent to the second activation period, raises the voltage level of the first control signal from the first power supply potential to a second power supply potential.

2. The semiconductor storage device according to claim 1, wherein in the third activation period, the word line control circuit controls the second control signal so that the second SRAM cell is electrically connected to the second bit line pair.

3. The semiconductor storage device according to claim 1, wherein the word line control circuit comprises:
a word line driver that outputs the first control signal;
a drive capability control circuit connected to a drive power supply terminal of the word line driver, the drive capability control circuit being configured to determine the second rate;
a voltage-boosted power supply circuit connected to the drive power supply terminal of the word line driver, voltage-boosted power supply circuit being configured to generate the second power supply potential by raising the first power supply potential and supply the second power supply potential to the word line driver; and
a control signal generation circuit that provides a signal corresponding to the first control signal to the word line driver and controls an active state of the drive capability control circuit and the voltage-boosted power supply circuit, and
wherein the control signal generation circuit brings the drive capability control circuit into an active state and the voltage-boosted power supply circuit into a non-active state in the first and second activation periods, and brings the drive capability control circuit into a non-active state and the voltage-boosted power supply circuit into an active state in the third activation period.

4. The semiconductor storage device according to claim 3, wherein the word line driver has a higher current drive capability than the drive capability control circuit.

5. The semiconductor storage device according to claim 3, wherein the voltage-boosted power supply circuit comprises a voltage boost driver circuit that controls an output terminal to the substrate potential or the first power supply potential based on a control signal supplied from the control signal generation circuit, and a capacitive element provided between the output terminal and the drive power supply terminal of the word line driver.

6. The semiconductor storage device according to claim 3, wherein all of the word line driver, the drive capability control circuit, the voltage-boosted power supply circuit, and the control signal generation circuit operate based on the first power supply potential.

7. The semiconductor storage device according to claim 1, wherein the word line control circuit maintains a voltage level of the first control signal at the first power supply potential in the third activation period in a data read operation, and the word line control circuit raises the voltage level of the first control signal from the first power supply potential to the second power supply potential in the third activation period in a data write operation.

8. The semiconductor storage device according to claim 1, wherein the predetermined voltage is a voltage lower than a threshold voltage of an access transistor of the SRAM cell.

9. The semiconductor storage device according to claim 1, wherein the word line control circuit starts the third activation period after the second SRAM cell holds storage data stored in the first SRAM cell.

10. The semiconductor storage device according to claim 1, wherein all of the first SRAM cell, the second SRAM cell, the word line control circuit, the sense amplification circuit, and the write control circuit operate based on the first power supply potential.

11. A semiconductor storage device comprising:
a plurality of first SRAM cells that store data, the plurality of first SRAM cells being arranged in a lattice pattern;
a plurality of first bit line pairs provided along first SRAM cells arranged in a column direction;
a plurality of second SRAM cells each provided for one of the first bit line pairs, each of the plurality of second SRAM cells being configured to amplify and store a potential difference between read signals output to a corresponding one of the first bit line pairs;
a control cell that controls an amplification function of the plurality of second SRAM cells;
at least one second bit line pair provided in the plurality of second SRAM cells;
a word line control circuit that outputs a first control signal used to activate first SRAM cells arranged on a row selected by a row address in the plurality of first SRAM cells, a second control signal used to activate a second SRAM cell selected by a column address in the plurality of second SRAM cells, and a third control signal used to activate the control cell;
a plurality of word lines provided along first SRAM cells arranged in a row direction, the plurality of word lines being configured to transmit the first control signal;
a sense amplification circuit that amplifies a potential difference between read signals output from a second SRAM cell activated based on the second control signal to the second bit line pair; and
a write control circuit that outputs a write signal to the second SRAM cell activated based on the second control signal through the second bit line pair,
wherein the word line control circuit:
in a first activation period, raises a voltage level of the first control signal from a substrate potential to a first power supply potential at a rate determined by a limited current having a limited maximum current value;
in a second activation period subsequent to the first activation period, maintains the voltage level of the first control signal at the first power supply potential; and
in a third activation period subsequent to the second activation period, raises the voltage level of the first control signal from the first power supply potential to a second power supply potential.

12. The semiconductor storage device according to claim 11, wherein in the first activation period, the word line control circuit raises a voltage level of the first control signal from the substrate potential to a predetermined potential at a first rate determined by a drive current value larger than the limited current and raises the voltage level of the first control signal from the predetermined potential to the first power supply potential at a second rate determined by the limited current.

13. The semiconductor storage device according to claim 12, wherein the predetermined potential is a voltage lower than a threshold voltage of an access transistor of the first SRAM cell.

14. The semiconductor storage device according to claim 11, wherein in the third activation period, the word line control circuit brings the second SRAM cell and the second bit line pair into an electrically connected state by using the second control signal.

15. The semiconductor storage device according to claim 11,
wherein the word line control circuit comprises:
a word line driver that outputs the first control signal;
a drive capability control circuit connected to a drive power supply terminal of the word line driver, the drive capability control circuit being configured to determine the second rate;
a voltage-boosted power supply circuit connected to the drive power supply terminal of the word line driver, voltage-boosted power supply circuit being configured to generate the second power supply potential by raising the first power supply potential and supply the second power supply potential to the word line driver; and
a control signal generation circuit that provides a signal corresponding to the first control signal to the word line driver and controls an active state of the drive capability control circuit and the voltage-boosted power supply circuit, and wherein the word line driver has a higher current drive capability than the drive capability control circuit.

16. The semiconductor storage device according to claim 15, wherein all of the word line driver, the drive capability control circuit, the voltage-boosted power supply circuit, and the control signal generation circuit operate based on the first power supply potential.

17. The semiconductor storage device according to claim 15, wherein the control signal generation circuit brings the drive capability control circuit into an active state and the voltage-boosted power supply circuit into a non-active state in the first and second activation periods, and brings the drive capability control circuit into a non-active state and the voltage-boosted power supply circuit into an active state in the third activation period.

18. The semiconductor storage device according to claim 15, wherein the voltage-boosted power supply circuit comprises a voltage boost driver circuit that controls an output terminal to the substrate potential or the first power supply potential based on a control signal supplied from the control signal generation circuit, and a capacitive element provided between the output terminal and the drive power supply terminal of the word line driver.

19. The semiconductor storage device according to claim 11, wherein the word line control circuit maintains a voltage level of the first control signal at the first power supply potential in the third activation period in a data read operation, and the word line control circuit raises the voltage level of the first control signal from the first power supply potential to the second power supply potential in the third activation period in a data write operation.

20. The semiconductor storage device according to claim 11, wherein the word line control circuit starts the third activation period after the second SRAM cell holds storage data stored in the first SRAM cell.

21. The semiconductor storage device according to claim 11, wherein all of the first SRAM cell, the second SRAM cell, the word line control circuit, the sense amplification circuit, and the write control circuit operate based on the first power supply potential.

22. A cell activation method for a semiconductor storage device comprising SRAM cells that hold externally-provided data, an activation state of the SRAM cells being controlled based on a first control signal provided through a word line, the cell activation method comprising:
in a first activation period, raising a voltage level of the first control signal from a substrate potential to a predetermined potential at a first rate, and then raising the voltage level from the predetermined potential to a first power supply potential at a second rate lower than the first rate;
in a second activation period subsequent to the first activation period, maintaining the voltage level of the first control signal at the first power supply potential; and
in a third activation period subsequent to the second activation period, raising the voltage level of the first control signal from the first power supply potential to a second power supply potential.

* * * * *